United States Patent [19]

Stickel et al.

[11] 4,393,315

[45] Jul. 12, 1983

[54] HIGH-GAIN STABILIZED CONVERTER

[75] Inventors: Tedd K. Stickel, Chalfont; Stephen A. Ransom, Huntingdon Valley, both of Pa.

[73] Assignee: Sperry Corporation, New York, N.Y.

[21] Appl. No.: 264,898

[22] Filed: May 18, 1981

[51] Int. Cl.³ .................. H03K 5/00; H03K 19/092
[52] U.S. Cl. ................................ 307/264; 307/362; 307/475; 307/268
[58] Field of Search ............ 307/362, 363, 475, 446, 307/448, 304, 296 R, 268

[56] References Cited

U.S. PATENT DOCUMENTS 3,676,700  7/1972  Buchanan ..................... 307/475
4,031,409  6/1977  Shimada et al. ............... 307/475

Primary Examiner—John Zazworsky
Attorney, Agent, or Firm—John B. Sowell; Kenneth T. Grace; Marshall M. Truex

[57] ABSTRACT

This invention provides a novel high-gain stabilized converter circuit which is adapted to convert emitter coupled logic (ECL) signals for use in gallium arsenide (Ga As) circuits. The novel converter is adapted to be made in gallium arsenide logic on the same chip as the logic circuitry which it is driving. The converter includes a novel differential amplifier having a level shifting network at the active input and a second level shifting network at the reference input to provide a stabilized high-gain circuit which is compensated for variations in temperature and process deviations.

13 Claims, 6 Drawing Figures

| VOLTAGE VALUES | | | FOR $V_t = -1.5$ |
|---|---|---|---|
| A | B | D | $Q_{10}$ IS: |
| -.9 | -2.3 | -1.80 | HARD ON |
| -1.1 | -2.5 | -1.75 | ON |
| -1.5 | -2.9 | -.90 | STILL ON |
| -1.7 | -3.1 | -.80 | BARELY ON |

| VOLTAGE VALUES | | | FOR $V_t = -.5$ |
|---|---|---|---|
| A | B | D | $Q_{10}$ IS: |
| -.9 | -2.3 | -.8 | BARELY ON |
| -1.1 | -2.5 | -.4 | JUST OFF |
| -1.7 | -3.1 | -.4 | STILL OFF |
| | | | |

HIGH-GAIN STABILIZED CONVERTER

BACKGROUND OF THE INVENTION

1. Field of the Invention

This invention is related to a high-gain converter, and more particularly relates to semiconductor circuitry which is provided on gallium arsenide (Ga As) integrated circuitry for converting Emitter Coupled Logic (ECL) input signals to be employed directly in Ga As logic. Thus, ECL output voltage levels may be directly read by Ga As integrated circuits.

2. Description of the Prior Art

Numerous different types or families of integrated circuits are commercially available. Manufacturers of integrated circuits usually produce families of devices which are completely compatible with each other. Many families of integrated circuits have characteristics which are similar and permit designers to mix families in the same system to obtain optimum performance.

It is not uncommon for families of integrated circuits to be incompatible and when the characteristics of such incompatible families of devices are not matched, some form of signal conversion is required to assure that logic signals are properly sensed and/or processed.

More than one type of problem can arise when two different types of logic are being connected in a system. The power supply levels may be different and the logic voltage swings may be different. The signals may also require reshaping, amplification and/or attenuation.

When the conversion or translation is from slower speed logic to faster speed logic, it is also important that the conversion logic does not create an inordinate time delay, otherwise, the reason for using a high-speed logic can be defeated by time delays at the interface converter.

These problems are understood and have been considered in typical translators and converters sold by numerous semiconductor houses including Motorola Inc. for interfacing ECL with transistor-transistor logic (TTL). These commercially available translators and converters can not be used or modified for use with ECL and Ga As logic without encountering some of the aforementioned problems as well as the problems of stability, switching time and ringing which occur with high-speed logic circuits.

It would be desirable to avoid or eliminate the known and understood problems of translation and/or conversion when adapting a conversion circuit for ECL to Ga As. Further, it would be highly desirable to provide the conversion circuitry as part of the input circuitry of the high-speed logic and to provide this logic as part of the integrated circuit being driven without the requirement of additional discrete components which would slow down the converter.

It would also be desirable if the converter or translating circuit has as few stages of logic as possible and that they be free of generated noise and also be compensated against age degradation and temperature variations. Further, it would be desirable that the translating or compensating network be free from variations due to power supply voltages.

SUMMARY OF THE INVENTION

It is a principle object of the present invention to provide a high-grain stabilized converter.

It is another object of the present invention to provide a high-gain ECL to Ga As integrated circuit converters.

It is another object of the present invention to provide a novel stabilized circuit employing a differential amplifier converter.

It is another object of the present invention to provide an improved high-gain converter which is fast acting and optimizes the performance of ECL to Ga As integrated level conversion circuitry.

It is another object of the present invention to provide an ECL to Ga As converter implemented as an integrated circuit in Ga As logic.

It is yet another object of the present invention to provide a new and improved converter employing a novel stabilized high-gain differential amplifier.

According to these and other objects of the present invention, there is provided a novel high-gain stabilized converter circuit adapted to be made integral with a Ga As circuit chip. The high-gain is provided by a novel differential amplifier having a level shifting network at the active input and a second level shifting network at the reference input to provide stability against temperature and process variations. The stabilized high-gain differential amplifier is biased by a reference voltage source so that the switching of the differential amplifier occurs at the mid-point of the incoming voltage signals.

DESCRIPTION OF THE PREFERRED EMBODIMENTS

Figure 1:
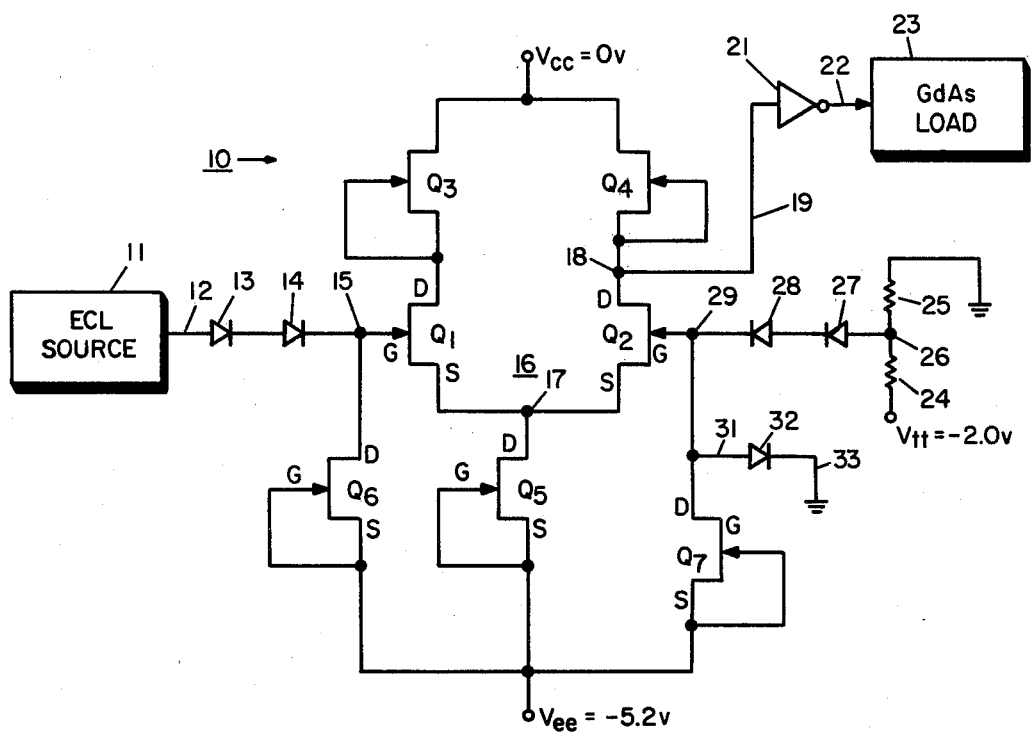
FIG. 1 is a schematic diagram showing a preferred embodiment compensated and stabilized high-gain converter.

Refer now to FIG. 1 showing the preferred embodiment converter. While the specific illustrated circuit is adapted to convert standard ECL output level voltages of typically minus 0.9 volts to minus 1.7 volts into typical standard Ga As level voltages of minus 0.4 volts to minus 1.8 volts, the high-gain stabilized amplifier converter can be modified to provide direct conversion between other families of logic.

The present invention is designed to be employed as a converter of logic signals from a slow speed logic family such as ECL to a high-speed logic family such as Ga As which operates in the range of 60 pico seconds per logic gate. Thus, an existing main frame computer employing ECL logic will be capable of employing high-speed Ga As memories or logic circuits to improve performance of the ECL main frame computer.

A differential amplifier is employed in the novel converter to assure that the translation circuit is stable. Every semiconductor device has slight variations due to process variations. These process variations cause the individual devices to exhibit changes in performance characteristics. In Ga As devices the major change in performance characteristics is due to variations in threshold voltage. Threshold voltage of a device may be defined as the threshold or voltage point where the semiconductor device first changes from an off condition to an on condition state.

FIG. 1 shows a preferred embodiment ECL to Ga As level converter 10. The ECL digital voltage source 11 is preferrably a bi-level source of input voltages which are provided on line 12 to the level shifting diodes 13 and 14 which cause a voltage drop and provide a shifted input voltage at node 15. In the preferred embodiment to the explained, all transistors are depletion mode type devices which are normally ON. The voltage on node 15 is applied to the gate of metal semiconductor field effect transistor Q1 (MESFET) of the differential amplifier 16. Preferably differential amplifier 16 comprises at least three transistors Q1, Q2 and Q5 which will be described in greater detail hereinafter. The voltage at node 15 swings between two levels to be described hereinafter causing the transistor Q1 to turn on or turn off. When the node 15 becomes more positive than the voltage on the gate of transistor Q2, Q1 turns on harder than Q2, thus, allowing the drain of the transistor Q2 to rise toward the positive supply voltage Vcc. When the node 15 becomes less positive than the voltage on the gate on transistor Q2, Q1 starts to turn off and Q2 turns on harder driving the drain of Q2 toward the source of Q2 which is the same as the drain of Q5. Thus, when the voltage swing at ECL source 11 is high at the gate of transistor Q1, it causes Q1 to conduct and produces an increased voltage at node 17 which is connected to the drain of transistor Q5 and the source of transistor Q2. The increased voltage at the node 17 causes Q2 to cease conducting and drives the node 18 at the drain of Q2 high.

When the shifted input voltage at node 15 is in the low condition, the transistor Q1 ceases to conduct and causes the node 17 to go low. Node 17 is connected to the source of transistor Q2 and when the source of transistor Q2 is in the low condition, it is conducting or driven into the conducting state thus pulling down the voltage at node 18 connected to the drain of Q2. This condition produces a low condition on output line 19 which is connected to inverter 21. The output of inverter 21 on line 22 is now at the proper logic levels and condition to drive Ga As logic devices of the type indicated at logic block 23. It will be understood that the transistors Q1 and Q2 are made at the same time and by the same process and are matched, thus, variations in the process which affect the individual transistors will affect them to the same extent, further providing the compensation hereinbefore mentioned.

Differential amplifier 16 also is comprised of a pair of current source load transistors Q3 and Q4. To provide the proper operation for the stabilized differential amplifier 16, the current source load transistor Q3 must have a larger or greater current value than the current source load transistor Q4 by a factor of approximately three to one. In the preferred embodiment design, this ratio of currents was established at approximately 17 to seven by providing the same ratio of gate stripe widths. It will be understood that the current source load transistors Q3 and Q4 could be replaced by substituting resistance loads for these transistors. However, this substitution would not provide as great a gain from the differential amplifier as that established for the preferred embodiment circuitry. A further purpose for providing transistors Q3 and Q4 instead of load resistors is that the performance characteristics of transistors Q3 and Q4 can be designed on the same circuit chips so that they match the performance characteristics of the current source transistor Q5.

Transistors Q3, Q4 and Q5 are understood to be preferably made on the same semiconductor chip and are oriented in the same direction to assure that the operation of the differential amplifier 16 is stabilized over the temperature and voltage variations that may be encountered for a device of this type. It will be understood that the transistors Q3, Q4 and Q5 are made at the same time and by the same process, thus variations in the process which affect the individual transistors will affect them to the same extent providing the compensation described.

The terminal voltage Vtt is applied across the voltage divider comprising resistors 24, 25 to a ground connection to provide an intermediate voltage at tap or node 26. The voltage at node 26 is supplied to the level shifting diodes 27 and 28 to provide a shifted voltage at node 29. It will be understood that this shifted voltage at node 29 is temperature compensated and process compensated with respect to the voltage at node 15. In this respect, the level shifting diodes 13 and 14 are connected to the drain of transistor Q6 which serves as an active input pull-down current source transistor to determine the voltage drop across the diodes 13 and 14. In similar fashion the level shifting diodes 27 and 28 cooperate with the reference input pull-down current source transistor Q7 to shift the supply voltage at node 26 down to the level required at node 29 for proper operation of the differential amplifier 16. It will be understood that the diodes 13 and 14 and transistor Q6 comprise a level shifting network which is identical to the level shifting network comprising diodes 27, 28 and transistor Q7. Since the two level shifting networks were made by the identical process, they are both temperature and process compensated relative to each other.

The node 26 establishes a reference voltage which is not supposed to change. This reference voltage has been designed to be equal to the mid-point or the switching threshold voltage of the voltage swing of the source 11. In the case of an ECL logic source this threshold voltage will be the mid-point of the voltage swings. For proper operation of the differential amplifier 16, the voltage reference at node 26 must be level shifted down to the proper voltage at node 29. The effect of providing the voltage source at node 26 equal to the mid-point of the ECL source 11 is to allow the mid-point of the differential amplifier 16 to switch the transistors Q1 and Q2 at the mid-point of the source voltage 11. The purpose of the level shifting networks comprising transistors Q6 and Q7 is to bring down the mid-point source voltage 26 to a reduced voltage at node 29 and to bring down the ECL voltage source 11 to its node 15 so that the proper operation of the differential amplifier 16 is maintained. It will be understood that if a plurality of input level shifting diodes had not been supplied, then the voltage at node 17 would not be low enough to allow the node 18 at the drain of transistor Q2 to appear as a proper and true logic low on output line 19 to permit inverter 21 to supply the proper logic high on output line 22 to the Ga As logic in block 23.

Thus, it will be understood that the voltage source at node 26 cannot be applied directly to the gate of transistor Q2, nor can the ECL voltage source 11 on line 12 be applied directly to the gate of transistor Q1 and obtain the proper operation of the differential amplifier 16.

When node 18 at Q2 is switching from high to low or low to high, some of the voltage change appearing at node 18 at the drain is coupled back to the gate and node 29 through the inherent drain to gate capacitance of Q2, thus, causing a change in the reference voltage at node 29. To minimize this transient effect at node 29, a large capacitance to ground will maintain node 29 at this desired dc reference voltage. Accordingly, node 29 is shown connected to line 31 and line 31 is connected to a large reverse biased diode 32 which is connected to ground through line 33. This large reverse biased diode has a relatively large reverse biased capacitance that acts as an ac shunt or coupling from node 29 to ground so as to minimize the transient effects occurring at node 18 which is switching and being reflected back to node 29.

A typical example of the preferred operation of differential amplifier 16 follows. The standard input voltage swings from ECL source 11 typically vary between a high of minus 0.9 volts to a low of minus 1.7 volts. When these input voltages or levels are applied to the input level shifting diodes 13 and 14, the input voltage is lowered by 1.4 volts at the input node 15. The reference voltage on node 26 has already been established at minus 1.3 volts which is the mid-point of the aforementioned input voltage swings. The voltage at node 29 will be 1.4 volts lower than the input at node 26. The voltage at node 29 and the gate of transistor Q2 thus is established at minus 2.7 volts dc level. This dc voltage is a reference voltage and is not designed to be changed for the logic family for which the circuit is designed. When the ECL input voltage on line 12 is at its high level or minus 0.9 volts, the voltage at the gate of transistor Q1 and node 15 is established at minus 2.3 volts. Thus, voltage on transistor Q1 is higher than the gate voltage on transistor Q2 and maintains transistor Q1 in the on condition and transistor Q2 in the off condition. If transistor Q2 is off, then node 18 is at its high potential which approaches the voltage of Vcc or approximately minus 0.4 volts. When the ECL input on line 12 is at its logic low or minus 1.7 volts, the gate voltage on transistor Q1 and at node 15 is at minus 3.1 volts. This low logic condition being more negative than the gate voltage on transistor Q2, shuts off transistor Q1 and turns on transistor Q2. This switching operation causes the voltage at node 18 to drop down to approximately the voltage at node 17 which is approximately minus 1.8 volts. The logic low voltage of minus 1.8 volts at node 18 is established as the logic low for inputs to Ga As logic gates such as inverter 21.

It is possible for the input voltage on line 12 to be equal to the reference voltage at node 26 during a transient basis. When the input voltages at line 12 and node 26 are equal, then the output of the differential amplifier at node 18 will typically sit at its mid-point, or minus 1.1 volts which is half way between the logic high and logic low levels of the standard Ga As inverter 21. In this fashion, the differential amplifier is balanced and has a high-gain around the mid-point of the ECL input source 11. Further, it will be noted that the positive supply voltage Vcc is preferably established at ground or zero volts, the most negative supply voltage Vee is established at minus 5.2 volts and the termination voltage Vtt is established at minus 2 volts. These supply voltages are the same voltages used for the novel Ga As differential amplifier and the ECL source. Further, these same source voltages may be used for the remaining logic on the Ga As integrated circuit chip.

It will be understood that the supply voltages shown and explained may require different values when the novel converter is employed with other types of logic. For example, if the source 11 was TTL instead of ECL logic, a larger number of level shifting diodes 13, 14 and 27, 28 would be employed in the series circuit to drop the input voltage to the range required for the differential amplifier. This would not require a change in the supply voltages. However, a preferred modification of the novel differential amplifier would require that Vcc, Vee and Vtt be raised by approximately 5 volts for interfacing with a TTL supply logic. In this event, the diodes 13, 14 and 27, 28 would be reversed and the current source pull-down transistors Q6 and Q7 reversed and supplied by the most positive supply voltage which is Vcc. Those skilled in the art of logic circuit design are familiar with the appropriate changes required for adopting the novel differential amplifier to other logic families.

Figure 2:
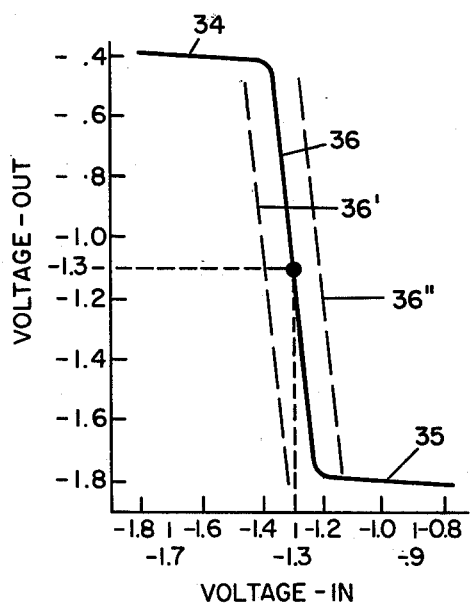
FIG. 2 is a transfer function diagram showing the characteristics of the converter of FIG. 1.

Refer now to FIG. 2 showing the transfer characteristics for ECL to Ga As level conversion. The active voltage input at line 12 is shown on the abscissa and the output voltage on line 22 is shown on the ordinate. Thus, when the voltage on line 12 is at a logic low of minus 1.7 volts, the output on line 22 is at a Ga As logic high of minus 0.4 volts. Similarly, when line 12 is at a logic high of minus 0.9 volts, the Ga As output voltage on line 22 is at a logic low of minus 1.8 volts. Thus, the output-high region 34 and the output-low region 35 of the transfer characteristic curve are joined by the transition or high-gain region 36. The transition portion 36 of the waveform is shown to provide a voltage gain of approximately 10. Buffer inverter 21 is capable of fanning out to drive approximately three loads.

As explained hereinbefore, the reference voltage at node 26 was established at the mid-point of the ECL source 11 incoming waveform at approximately minus 1.3 volts. When the incoming waveform on line 12 is slightly greater than minus 1.3 volts the output of the converter 10 will be in the low region 35 because of the high-gain of the differential amplifier 16. Similarly, when the incoming voltage on line 12 is slightly less than minus 1.3 volts, the output of the Ga As level converter on line 22 will be in a logic high state in the region shown at 34.

Transition region 36' represents the actual gain waveform region when the threshold voltage of the Ga As converter has a high threshold deviation from the norm. Similarly, transition region 36" represents the low threshold deviation from the norm. Even though the gain region or the novel converter may fall between the transition regions 36' and 36", it is shown that the high-gain portion of the curve remains as a high gain and that the high and low output logic levels remain well established in the same region which is not the case for an inverter type translator.

Figure 3:
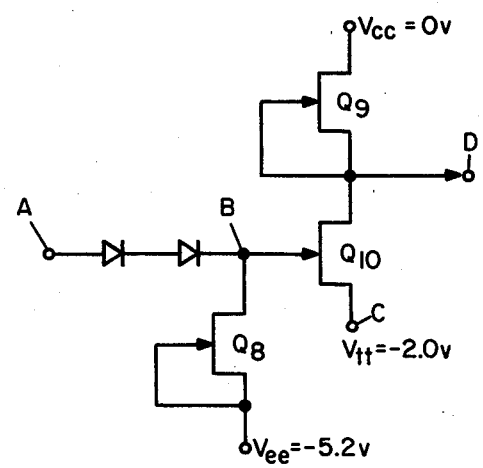
FIG. 3 is a schematic diagram of a simple field effect transistor inverter without compensation or stabilization.

Refer now to FIG. 3 showing a schematic diagram for a simple field effect transistor inverter without compensation or stabilization. The same supply voltages as employed in FIG. 1 are shown to be applied to the inverter of FIG. 3. Due to deviations in the threshold voltage of the Ga As devices, transistors Q8, Q9 and Q10 there will be decidedly different results of the high and low output logic levels at node D when the same input voltages are applied at node A. For purposes of this explanation assume that the threshold deviation of the Ga As devices in the simple inverter of FIG. 3 are similar to the deviations explained with respect to FIG. 2. Then, the high threshold for the FIG. 3 Ga As device would be minus 1.5 volts and the low threshold for the Ga As devices of FIG. 3 would be minus 0.5 volts. The different transfer characteristics for these two conditions are shown superimposed on the transition portion of the waveform 36 shown in FIG. 2.

Assuming that the threshold voltage is high for the Ga As devices of FIG. 3. The high threshold transfer characteristic is shown by waveform 37, 38, 39 in FIG. 4 and the table of FIG. 5 will be employed to explain FIG. 3. When the input voltage is at minus 0.9, the voltage at node B is at minus 2.3 volts and the output voltage is at minus 1.8 volts because transistor Q10 is hard on and the output at node D will be close to the voltage at node C, which is at minus 2 volts and establishes the low output logic portion of the curve at 38. As the input voltage at node A decreases to minus 1.1 volts the output at node D enters the gain or transition region 37 of the curve and begins to rise because the transistor Q10 is not on as hard as before. When the input voltage at node A approaches minus 1.5 volts the voltage at node B is at approximately minus 2.9 volts and the output voltage at node D rises to approximately minus 0.9 volts and the transistor Q10 is still on. By the time the input voltage at node A is at minus 1.7 volts, the output voltage at node D is at approximately minus 0.8 volts and the transistor Q10 is still barely on. This condition establishes the high logic level region 39 of the waveform in FIG. 4. It will be noted that the logic high at region 39 is at minus 0.8 volts and this logic high is not at the desired level of minus 0.4 volts which the next logic Ga As device requires for logical operations. Thus, it will be understood when the threshold voltage deviation is in the high condition as shown in FIGS. 3, 4 and 5, the waveform 37, 38, 39 is produced and does not provide the desired logic levels for driving Ga As logic elements.

Figures 4, 5, 6:
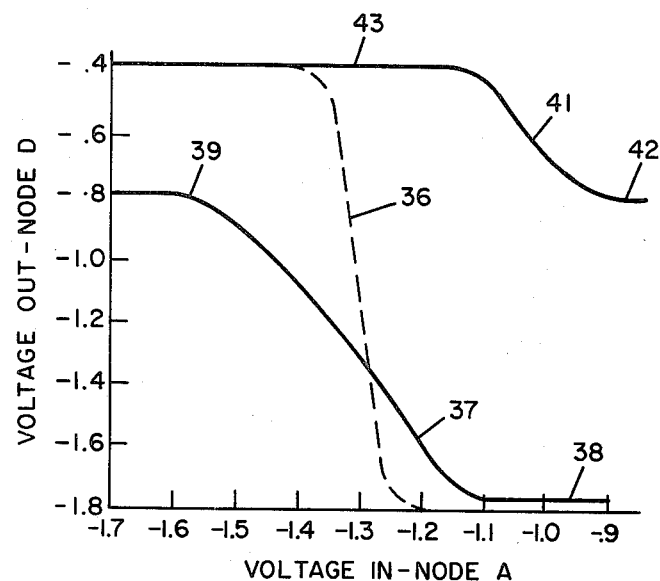
FIG. 4 is a transfer function diagram showing the characteristics of the simple inverter of FIG. 3 when the devices have different threshold voltages.
FIG. 5 is a table of voltages which are encountered in the circuit of FIG. 3 when a high Ga As device threshold voltage is encountered.
FIG. 6 is a table of voltages encountered in the circuitry of FIG. 3 when a low Ga As device threshold voltage is encountered.

Refer now to FIGS. 3, 4 and 6 and assume that the threshold voltage deviation is low and provides a threshold voltage of minus 0.5 volts. Under these conditions, when the voltage input at node A of FIG. 3 is at minus 0.9, volts, the voltage at node B is at minus 2.3 volts which causes transistor Q10 to be barely on and the output at node D to be at approximately minus 0.8 volts. The low logic region 42 is shown in FIG. 4 for this condition. When the input voltage at node A decreases to minus 1.1 volts, the voltage at node B is approximately minus 2.5 volts and the output at node D is at approximately minus 0.4 volts which defines the logic high for the inverter of FIG. 3. This high logic region is shown at region 43 in FIG. 4. Thus, the gain region is between the high region 43 and the low region 42 as shown at the transition region 41, and the transistor Q10 has just assumed the off condition. Further decreases in the voltage at node A to minus 1.7 volts no longer causes a change in the output at node D and the transistor Q10 is still off. It will be noted by examining the waveform of FIG. 4 that the high logic region 43 is at a proper minus 0.4 volts for input to the next element of the Ga As logic, however, the low logic region 42 is now established at minus 0.8 volts and is incapable of switching the next following Ga As element.

To summarize the waveforms of FIG. 4, it may be said that when the threshold voltage is low as shown in the table of FIG. 6 that the waveform 41, 42, 43 is produced and clearly is incapable of driving a next stage of Ga As logic. Similarly, the high threshold voltage condition for the inverter of FIG. 3 which is shown in FIG. 5 produces the waveform 37, 38, 39. While this waveform is shown to be capable of driving a stage of Ga As logic when in its low level logic condition, there is always some doubt whether the high logic condition shown at 39 is capable of driving the next stage of Ga As logic because the next stage wants to see minus 0.4 volts as a logic high. Superimposed in phantom lines on the transfer characteristics of FIG. 4 is the transfer characteristic of the novel converter shown in FIG. 1. It will be understood that this transfer characteristic waveform 36 would be produced if the node A voltage was applied at line 12 to produce an output voltage at line 22.

Having explained a preferred embodiment of the present invention, it will be understood that small deviations in the input levels of the ECL source and output levels at the Ga As load 23 may be made without degradation of the performance of the circuit shown in FIG. 1. Thus, it will be understood that the explained voltage levels are the preferred levels and proper operation and design of the circuit may be accomplished with further modifications to the circuit of FIG. 1. While the preferred embodiment structure has been explained and designed for digital operations it will also be understood that because of the high linear gain of the differential amplifier that linear functional operations are possible with this novel differential amplifier converter.

We claim:

1. A high-gain level converter for employing emitter coupled logic (ECL) source signals as an input to gallium arsenide (Ga As) logic circuitry, comprising:
    a first plurality of Ga As level shifting diodes couplable to said ECL source signals,
    an input node line coupled to the output of said first plurality of diodes,
    a voltage source,
    a Ga As differential amplifier of the type comprising at least three transistors arranged as an active input transistor, a reference input transistor and a current source transistor couplable to said voltage source,
    said input node line being connected to the gate of said input transistor of said differential amplifier,
    a voltage divider having an intermediate voltage tap whose output voltage is approximately equal to the mid-point switching voltage of said ECL source signals,
    a second plurality of Ga As level shifting diodes having an input coupled to said intermediate voltage tap of said voltage divider,
    an output node line coupled to the output of said second plurality of diodes, and
    said output node line being connected to the gate of said reference input transistor to provide an inverted output at the drain of said reference input transistor to provide a Ga As output voltage line compatible with the input voltage swings required for Ga As logic circuitry.

2. A high-gain level converter of the type set forth in claim 1 which further includes a Ga As inverter coupled to said Ga As output line to provide a fan-out buffer between the Ga As logic circuitry and said output line.

3. A high-gain level converter of the type set forth in claim 1 wherein said differential amplifier further includes a pair of Ga As current source load transistors, one of said load transistors being coupled in series with and oriented in the same direction as said active input transistor of said differential amplifier, and the other of said pair of current source load transistors being coupled in series with and oriented in the same direction as said reference input transistor of said differential amplifier.

4. A high-gain level converter of the type set forth in claim 3 wherein said current source load transistor of said active input transistor of said differential amplifier has a larger current when conducting than said other current source load transistor.

5. A high-gain level converter of the type set forth in claim 4 wherein the ratio of the conducting current of said current source load transistors is approximately three to one.

6. A high-gain level converter of the type set forth in claim 5 wherein the ratio of the conducting current of said current source load transistors is approximately seventeen to seven.

7. A high-gain level converter of the type set forth in claim 4 wherein the ratio of the conducting currents of said current source load transistors is established by providing a larger gate stripe width in one of the current source load transistors by approximately the ratio of conducting currents desired.

8. A high-gain level converter of the type set forth in claim 1 which further includes a back biased Ga As diode connected to the gate of said reference input transistor of said differential amplifier to provide a bypass capacitor for minimizing transient effects when said reference input transistor is switching.

9. A high-gain level converter of the type set forth in claim 1 which further includes an active input pull-down current source transistor and a reference input pull-down current source transistor.

10. A high-gain level converter of the type set forth in claim 9 wherein said active input pull-down current source transistor is connectable between said input node and said voltage source of said differential amplifier and said reference input pull-down current source transistor is connectable between said reference node and said voltage source of said differential amplifier.

11. A high-gain level converter as set forth in claim 10 wherein said active input pull-down current source transistor and said first plurality of level shifting diodes comprise an active input level shifting network.

12. A high-gain level converter as set forth in claim 11 wherein said reference input pull-down current source transistor and said second plurality of level shifting diodes comprise a reference input level shifting network identical to said active input level shifting network, whereby said networks stabilize operation of said differential amplifier against variations in temperature, voltage and process fabrication.

13. A high-gain level converter for translating voltage swings of a slower logic family of semiconductors to a faster logic family of semiconductors, the circuitry being implemented on the semiconductor chip of the faster logic family, comprising:

a first plurality of level shifting diodes adapted to receive input signals from the slower logic family, an input node line coupled to the output of said first plurality of diodes, a voltage source, a differential amplifier comprising at least three transistors arranged as an input differential pair having an active input transistor and a reference input transistor and a current source transistor couplable to said voltage source, said input node line being connected to the gate of said active input transistor of said differential pair, a voltage divider having an intermediate voltage tap whose voltage output is approximately equal to the switching threshold voltage of the slower logic family of semiconductors, a second plurality of level shifting diodes having an input coupled to said intermediate voltage tap of said voltage divider, an output node line coupled to the output of said second plurality of diodes, and said output node line being connected to the gate of said reference input transistor of said differential pair to provide an output voltage compatible with the full range of input voltage swings of said faster logic family of semiconductors and adapted to be coupled thereto.

* * * * *